United States Patent [19]

Kuzdrall

[11] 4,401,104
[45] Aug. 30, 1983

[54] THERMAL GAIN SENSOR

[76] Inventor: James A. Kuzdrall, Box 1247, Nashua, N.H. 03061

[21] Appl. No.: 236,121

[22] Filed: Feb. 19, 1981

[51] Int. Cl.³ ............................................. F24J 3/02
[52] U.S. Cl. ..................................... 126/419; 126/422; 250/338; 250/349; 374/121; 374/132
[58] Field of Search ............ 126/419, 422; 374/121, 374/132; 250/338, 349

[56] References Cited
U.S. PATENT DOCUMENTS

| | | | |
|---|---|---|---|
| 2,595,905 | 5/1952 | Telkes | 126/419 |
| 2,994,772 | 8/1961 | Green | 250/349 |
| 3,427,808 | 2/1969 | Butcher | 126/419 |
| 3,860,055 | 1/1975 | Wild | 126/419 |
| 3,922,553 | 11/1975 | Bachmann et al. | 250/338 |
| 4,150,552 | 4/1979 | Altman | 126/419 |
| 4,222,367 | 9/1980 | Jubb | 126/419 |
| 4,250,712 | 2/1981 | Meloni | 126/422 |

*Primary Examiner*—Ronald C. Capossela
*Attorney, Agent, or Firm*—Schiller & Pandiscio

[57] ABSTRACT

The thermal gain sensor detects, by a simplified method, the direction of net energy flow through a fluid-separation barrier (window). In particular, the sensor determines a balance point above which the radiant energy (solar, microwave, X-ray, etc.) gained through the barrier exceeds the energy lost through the barrier from the combined effects of convection and conduction.

One application of the thermal gain sensor pertains to a solar energy collector or solar heated room. The sensor controls movable insulation panels or curtains which reduce the energy flow through the collector window (barrier) when the energy flow is in the wrong direction. The sensor may be used to either maximize or minimize the energy in the collector or room.

The sensor simulates the absorptivity and convection loss of the controlled environment by means of an insulated, darkened disk slightly spaced from the barrier surface. Operation is independent of the temperatures on either side of the barrier, the width, thickness, and composition of the barrier, and, in practice, the height of the barrier. Operation is also independent of the nature of the fluid outside the barrier, and the sensor can be configured to operate with any type of fluid in the controlled environment.

48 Claims, 6 Drawing Figures

THERMAL GAIN SENSOR

BACKGROUND OF THE INVENTION

1. Field of Invention

The present invention relates generally to controls, and specifically to a simplified method of sensing the direction of net energy flow through a fluid-separation barrier which transmits a radiant energy flux. Particular applications include the control of thermal shutters in industrial processes, solar collectors, and solar space heaters.

2. Prior Art

Heretofore, control of industrial processes and solar collectors by means of thermal gain was not widely employed because of the in-accuracy of simple means and the complexity of accurate means.

One heat transfer problem, well understood in theory, involves a net absorption of radiant energy by the controlled environment on the one hand, and loss of thermal energy to a cooler outside environment on the other. The energy loss results from: heat transfer by convection from the controlled environment to the window surface; heat transfer by conduction through the materials and air spaces comprising the window; and heat transfer by convection (natural and possibly forced as in the case of wind) to the cooler outside environment.

As an example, consider a south facing window used as a solar collector in the winter. The window is fitted with curtains (solar shutters) to reduce heat loss. The problem is when should the curtains be opened.

As a simple approach to this control problem, the curtains are drawn at night and opened in the day. A solar cell based controller might be used to automate the opening and closing. For lack of more accurate information, the occupant has assumed that whenever the sun is shining energy is being gained. A closer consideration, however, shows that thermal losses through a window can easily exceed the radiant gain, depending on the outside temperature, sun angle, cloudiness, and wind. Quite often, the curtains should be drawn even though sun is coming through the window.

For improved collection efficiency, the control method must consider the energy losses out of the window as well as the radiant energy gain into the window. The most difficult loss factor to determine is the convective transfer of the room air to the window. By present methods, this requires sophisticated instrumentation to measure the fundamental quantities and calculate the net energy flow from the governing equations. This includes accurate measurement of: the outside temperature, any "wind" or forced movement of the outside fluid, the thermal conductivities and thicknesses of all window materials, the inside temperature, the absorptivity of the controlled environment, and the net amount of radiation entering the controlled environment. In addition, certain thermal properties of the inside and outside fluids must be known over the operational temperature range, namely: kinematic viscosity, coefficient of volume expansion, density, specific heat, and the thermal conductivity.

An automated control using these measurements requires a sophisticated electronic computer capable of storing tables of empirical fluid characteristics and capable of computing fractional powers of numbers. Further, complex sensors and instrumentations are required on both sides of the barrier. In addition, a new "program" is required for different window compositions and fluids.

OBJECTS

Accordingly, it is the object of this invention to provide:

A more accurate primary sensor which does not require auxiliary computation, electrical or otherwise, to produce the desired signal.

A physically small, flat sensor of minimal protrusion suitable for mounting between the barrier and the thermal shutter.

A sensor which makes all measurements from the controlled-environment side of the barrier.

A sensor which does not require knowledge of the properties or physical state of the fluid outside the barrier.

A sensor which does not require knowledge of the thickness or composition of the barrier.

A sensor which can be configured to operate with any fluid (gas or liquid) on the controlled environment side of the barrier.

A sensor which can be configured for use with all forms of radiant energy (solar, infra-red, diathermy, microwave, X-ray, etc.) by proper material selection.

A sensor which performs accurately over a wide range of temperature on either side of the barrier without adjustment.

A sensor which consumes very little electricity, making it suitable for battery operation.

A sensor which could be self-powered by the radiation it senses.

A sensor whose thermal-time-constant is adjustable by design.

And further objects and advantages which will become apparent from a consideration of the drawings and ensuing description thereof.

SUMMARY OF THE INVENTION

To accomplish the foregoing and other objects of this invention, there is provided a compact thermal gain sensor which gives an accurate model, or analog, of the thermal and radiative transfer processes taking place across the barrier or window. In this analog, a darkened surface has the effect of, or simulates, the absorptive and temperature characteristics of materials on the controlled side (inside) of the barrier. The barrier itself, being in contact with the outside fluid, simulates the conductive and outside convective loss when its inner surface is at the correct temperature.

To produce said correct temperature, it is necessary to accurately represent the thermal transfer of the freely convecting (moving) inside fluid. To this end, consider a thin space containing the fluid. In the thin space, the thermal transfer results from the thermal conductivity of the fluid. Since this transfer is inversely proportional to the space's thickness, the thermal transfer is very high for very thin spaces. As the thickness of the space is increased, the thermal transfer decreases to a lower value and ultimately reaches a minimum. Beyond this spacing, the thermal transfer begins to increase due to convective heat transfer which becomes possible in larger spaces. Thus, it is always possible to find a thin, non-convecting space that has the same thermal transfer as a large, free-convecting space. Although the exact dimensions in the foregoing depend on the temperatures and the fluid, all fluids behave in this same general manner.

With this observation made, the analog is completed by using an appropriate (computer calculated) thin space between the darkened surface and the barrier to simulate the convective transfer process. Although this simulation is accurate only when the darkened surface is at one specific temperature, it has been discovered and herein proved that at this temperature the energy input and energy loss are exactly equal. It is further shown that this specific temperature is equal to the inside fluid's temperature. Thus, the coincidence of the darkened surface's temperature and the room temperature is the desired switching point for a controller and the point of high accuracy for this model.

Numerous other features and advantages of the invention should now become apparent from the detailed drawings and descriptions which follow.

BRIEF DESCRIPTION OF THE DRAWINGS

FIG. 3 shows a practical circuit by which the sensor controls a motorized shutter or the like.

PHYSICAL DESCRIPTION OF THE INVENTION

Figure 1:
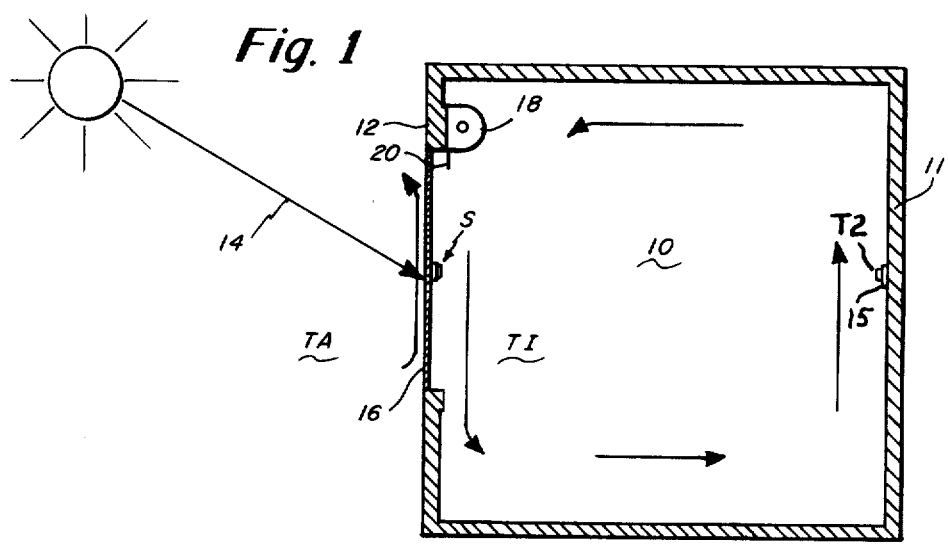
FIG. 1 is a sectional view in elevation which schematically depicts a solar collector in the form of a room with a thermal shutter or shade.

FIG. 1 schematically depicts a typical application for the concepts of this invention. It shows a room 10, which may be referred to herein as a solar collector, having a front wall 12 positioned to receive energy from the sun, the incident energy being illustrated by the arrow 14. The front wall 12 suitably supports a transparent convection barrier 16 which may be referred to herein as a solar collector window. The reference character TA represents the temperature outside the window while TI represents the temperature in the room. FIG. 1 also shows a motor 18 for moving the thermal shade or shutter 20. A thermal gain sensor S is attached to the window on its inner surface. In this application, the sensor S is preferably disposed between the window 16 and the shade 20 when the shade is closed. A control box 15 containing circuitry to control the motor 18 is here shown mounted on the rear wall 11. A temperature sensing means T2 which measures the room temperature TI is mounted on the control box 15.

Figures 2A, 2B:
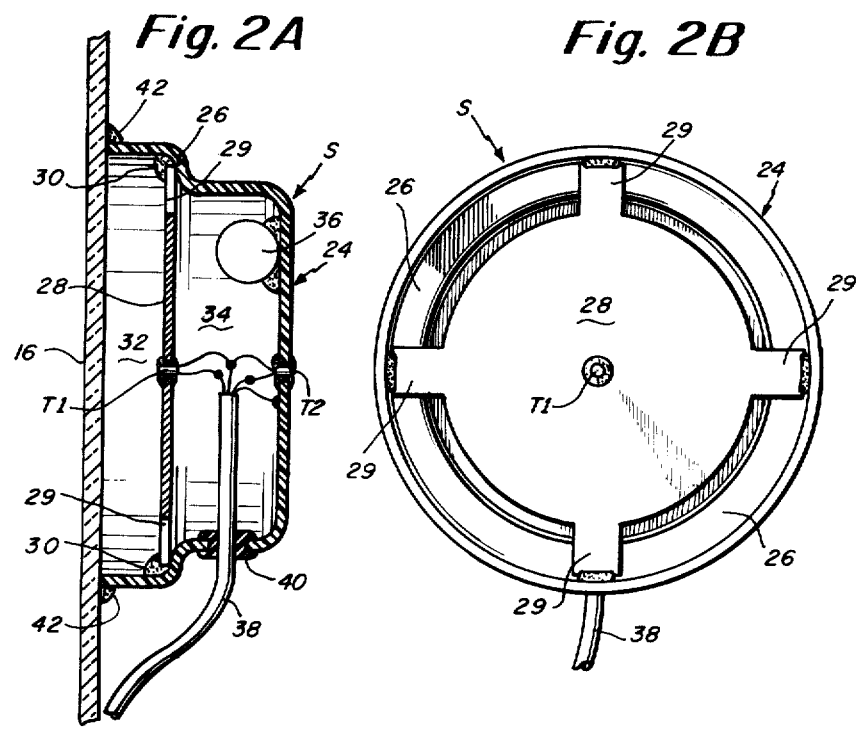
FIGS. 2A and 2B depict detailed views of a sensor construction wherein both sensor thermistors are associated with the sensor housing.

FIGS. 2A and 2B depict detailed views of a sensor. In this embodiment, the sensor is comprised of a rather shallow plastic housing 24 that is open at one end and has a peripheral step which forms the peripheral shoulder 26. A relatively thin, darkened disk 28 is mounted against the shoulder 26. The mounting is provided by four tabs 29 extending from the disk and integral therewith. An epoxy glue 30 may be used to secure the disk at the tabs 29 to the shoulder 26. As depicted in FIG. 2A, the disk 28 along with a section of the window 16 forms a relatively thin air space 32 which simulates the inside convection co-efficient HI, discussed in detail hereafter. In one application, designed for air, the space is 7.1 mm (0.28 inches) measured between the window and the disk itself. The sensor housing may be secured to the window 16 as in FIG. 1 by an epoxy glue 42 which preferably provides a total seal about the entire periphery of the housing 24. Behind the disk 28 is a compartment 34 which contains insulating material, preferably still air, which thermally isolates the back of the disk from the housing. The compartment 34 also contains wiring and is electrically shielded by means of conductive paint on the inner surface of the housing 24. The compartment 34 also contains a desicant capsule 36 which may be epoxy glued to the inner surface of the housing 24. This capsule, if required, absorbs any moisture that may occur inside the sensor housing (spaces 32 and 34). FIG. 2A shows one arrangement of the temperature sensors T1 and T2 wherein both are associated with the sensor housing. This arrangement is preferable when, unlike FIG. 1, the sensor does not get covered by the thermal shade. The temperature sensors, preferably thermistors, measure the temperature of the disk and the housing (room) respectively. A standard cable 38 passes through an air-tight gromet 40 coupling the temperature sensors to the Controller of FIG. 3.

Figure 3:
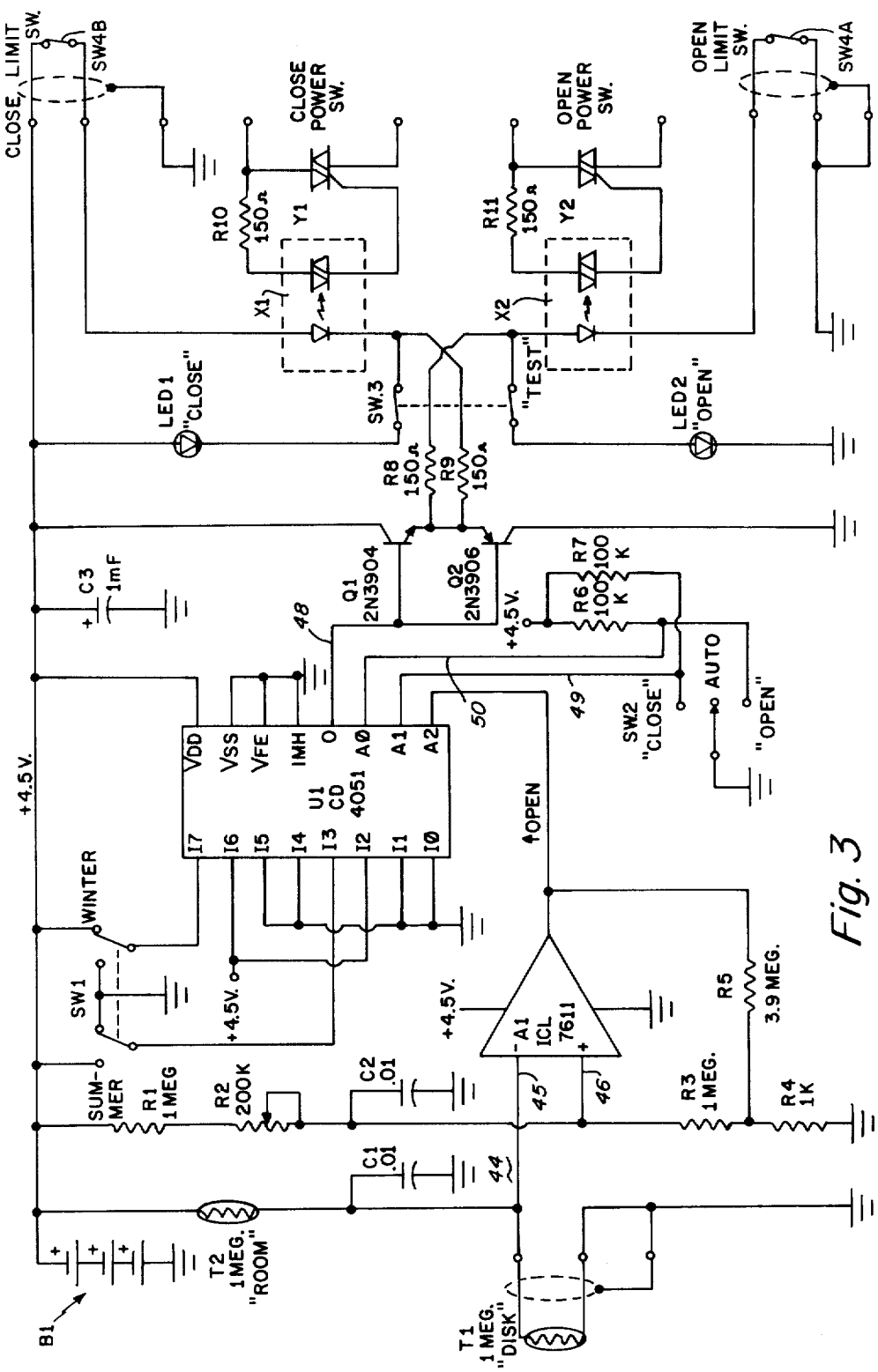

FIG. 3 illustrates one circuit that may be employed with the sensor of this invention to control a solar shutter or the like. For instance, it could power motors 18 to move the thermal shade 20 of FIG. 1. The circuit shows one preferred arrangement for the thermistors wherein T1 is associated with the sensor and T2 is located in the Controller. Thus, in FIG. 3, there is shown an input for the thermistor T1 of FIG. 4A which forms a bridge with T2, R1+R2, and R3+R4.

The circuit comprises a bridge circuit 44 which couples to amplifier A1 and a series of electronic and mechanical control switches including U1, SW1, and SW2. The signal resulting from the control switches appear on lead 48 and activates either the Close Power Switch or the Open Power Switch.

At the input bridge 44, thermistors T1 and T2 measure the disk and room temperatures, respectively. These thermistors form two arms of the bridge. A third arm is formed by resistor R1 and the variable resistor R2, which nulls offsets caused by component tolerances. The remaining arm of the bridge is formed by the series resistors R3 and R4.

The bridge output is taken at leads 45 and 46, which couple to the input of amplifier A1. The amplifier A1 is a low power consumption CMOS type, preferably the Intersil ICL-7611. It draws only 10 microamperes from the 4.5 volt supply B1 providing operation for one year or longer with inexpensive AA cell batteries.

Under the condition of the disk becoming warmer than the room, meaning that the net heat flow is into the room, the resistance of thermistor T1 is less than that of thermistor T2. This imbalance drives the amplifier A1 to a positive output. Resistor R5 coupled from the output of the amplifier to lead 46 by way of resistor R3 provides a small amount of positive feedback (hysteresis) to assure that the output is either fully positive or fully negative.

The bridge amplifier sensitivity of one millivolt, controlled by the hysteresis, corresponds to a temperature difference of 0.06 degrees F. With such high sensitivity, it is preferred to prevent shutter movement for small insolation changes such as a passing cloud. This is done by adjusting the thermal mass of the disk to give a longer time constant.

FIG. 3 also shows a 1-of-8 selector circuit U1, preferably a CMOS type CD-4051 which typically draws less than one microampere of supply current. The selector circuit U1 provides the switching logic in association with the switches SW1 and SW2.

The Summer-Winter switch SW1 is a double pole, double throw switch. In the "winter" position, 4.5 volts is coupled to input I7 while ground potential is applied to input I3 of the selector U1. In the opposite "summer" position, the ground potential is applied to input I7 and 4.5 volts is applied to input I3.

The mode switch SW2 has three positions, "close", "auto", and "open". In the "auto" position, a logic 1 (4.5 volt) signal is coupled to address inputs A0 and A1 of selector U1 via resistors R6 and R7 and leads 50 and 49. The remaining address input of the selector A2 is driven directly by the bridge amplifier. The amplifier's output directs either input I7 or I3 to the selector's output O and thence via lead 48 to the control transistors Q1 and Q2. The level of the output O, either 0 volts which turns on Q2 or 4.5 volts which turns on Q1, is determined by the position of the summer-winter switch SW1.

With SW2 in the "close" position, address input A1 is brought to a logic 0 level. The selector now directs either input I1 or I5 to its output O in response to the output of the bridge amplifier. Since both of these inputs are at zero volts, only Q2 will activate, keeping the shutter closed regardless of the state of the bridge amplifier's output.

With SW2 in the "open" position, address input A0 is brought to a logic 0 level. The selector now directs either input I2 or I6 to its output O in response to the output of the bridge amplifier. Since both of these inputs are to 4.5 volts, only Q1 will activate, keeping the shutter open regardless of the state of the bridge amplifier's output.

Thus, SW2 provides a manual override of the automatic control from the amplifier A1.

The transistors Q1 and Q2 buffer the selector output O, providing the additional current drive. Transistor Q1 is a general purpose NPN type, preferably a 2N3904, while transistor Q2 is a general purpose PNP type, preferably a 2N3906. The emitters of these transistors are tied in common and couple by way of either resistor R8 or resistor R9 to the respective opto-couplers X1 and X2. Each of these couplers includes its own electrically isolated triac that couples across the power switch triacs Y1 and Y2. The couplers isolate the low power control circuitry from the high power motor driving circuits.

The independent power circuits associated with Y1 and Y2 allow direct use with split-capacitor reversible AC motors or use with complete systems such as a garage door opening systems. When driving the shutter motor directly, the components shown in FIG. 3 are adapted for controlling up to a one-half horsepower AC motor.

FIG. 3 also shows an open limit switch SW4A and a close limit switch SW4B. These switches are wired and arranged to open when the particular limit is reached. Since each of these switches is coupled in series with an opto-coupler, an open contact condition stops the motor and eliminates unnecesary battery drain through the active transistor, Q1 or Q2. These switches are maintained closed until the limit is reached, at which time one of the switches opens, depending on whether the shutter is being opened or closed.

The test switch SW3 serves a dual purpose. It provides a battery test and serves as a guide for manually controlling the shutter when the AC motor power is off. When the test button or test switch SW3 is pushed, either the "open" lamp LED2 or the "close" lamp LED1 is illuminated. This information is used to manually set the shutter. If neither lamp comes on, the batteries must be replaced.

Figure 4B:
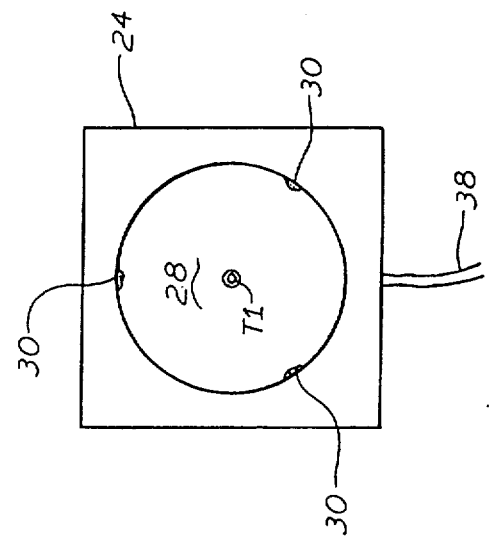
FIGS. 4A and 4B depict detailed views of an alternate construction for the sensor wherein one thermistor is associated with the sensor housing.
Figure 4A:
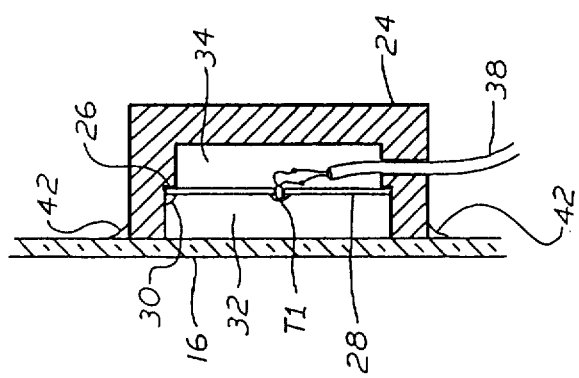

FIGS. 4A and 4B depict an alternate embodiment of the invention with a second preferred arrangement for the temperature sensors wherein only T1 is associated with the sensor, T2 being located as shown in FIG. 1. This configuration is suitable for mounting between the window and the thermal shutter as in FIG. 1. In this embodiment, the housing 24 is a block of thermally insulating plastic foam, preferably poly-urethane foam. The block may be shaped by molding or by machining. The darkened disk 28 is held against the insulating shoulder 26 by several dabs of epoxy 30. The shoulder 26 is at a depth such that the space 32 formed by the disk 28 and the window 16 has a thickness that will accurately simulate the convective heat transfer previously mentioned. The housing 24 is secured to the window by an adhesive glue 42 preferably forming an air-tight seal about the periphery. A temperature sensing means T1, preferably a thermistor, is mounted in thermal contact with the disk and secured with glue or epoxy. The signal from T1 leaves the sensor via a cable 38 which passes through an air-tight hole in the housing. The still air space 34 behind the disk provides room for connections to T1 and supplements the housing insulation which thermally isolates the disk from the air surrounding the sensor.

OPERATION OF THE INVENTION

The operation of the solar collector room, depicted in FIG. 1, is given as a typical application. The sensor S is mounted against the window 16 while the Controller and T2 are here shown mounted on the rear wall 11. Assume it is just before dawn, the shutter 20 is down, and the outside air TA is much cooler that the inside air TI. The long night and the insulating shutter have left the temperature of T1 some where between TI and TA. With thermistor T1 measuring a lower temperature (higher resistance) than T2 and the Controller switch SW1 set "Winter", the amplifier A1 maintains a "Close" signal.

As the sun rises and its rays hit the disk, the temperature T1 begins to increase. At perhaps some later time in the day, the insolation is enough to raise the disk temperature to TI dispite the energy loss out the window through the air-space 32. At this time the amplifier A1 switches to "Open" and activates the "Open" motor. The energy flow into the room is now positive.

As the day continues, the insolation gets perhaps stronger and T1 continues to rise above T2 (TI). As the sun begins to weaken in the afternoon, however, or as TA gets much colder or as TI increases, T1 passes back to the threshold condition, T1=T2=TI, and the amplifier signals "Close", activating the "Close" motor 18. The shutter remains closed, minimizing energy loss out of the room, until such time as there would again be a positive energy gain into the room with it open.

It is also clear from the foregoing that reversing the sense of the motor control, accomplished by the Summer-Winter switch SW1 in the Controller, would close the shutter when heat was entering the room either from the sun or from TA being higher than TI. In practical application this would reduce summer air cooling requirements on hot days.

THEORETICAL BASIS OF THE INVENTION

By way of explaining the theory of the invention, this discussion develops a mathematical model for the energy balance in the room of FIG. 1 and, with a second mathematical model, shows that the sensor of FIG. 2 accurately senses the energy balance of the room.

In this discussion, "inside" and "outside" will be used to identify components and parameters associated with the spaces on either side of the barrier. The outside space is that which contains the radiation source, for example, the sun. The inside space is that which receives the radiation, for example, a solar collector room.

The energy gain through the solar collector window is:

energy gain = PC*K*incident energy where

PC = absortion co-efficient of the room
K = combined effects of transmission, reflection, and incidence angle The energy lost through the window depends on the convection coefficients on both sides of the window as well as the thermal resistance of the window itself:

energy lost = (TI − TA)/(1/HA + RW + 1/HI)

where

TA = outside ambient temperature
TI = inside temperature
HA = outside convection co-efficient
RW = thermal resistance of the window
HI = inside convection co-efficient From these equations, the net energy gain for the room is:

net gain = energy gain − energy lost

Having now set forth some equations governing the thermal behavior of the room, the thermal description of the sensor, particularly the disk, proceeds.

The energy gained by the disk is:
energy gain = PS*K*incident energy where

PS = radiant absorptivity of the disk

The energy lost by the sensor disk is:
energy lost = (TD − TA)/(1/HA + RW + R1) + (TD − TH)/(R2 + R3)

where

R1 = thermal resistance, disk to window
R2 = thermal resistance, disk to sensor case
R3 = thermal resistance, disk to end cap of case
TD = temperature of disk
TH = temperature of housing The fluid thickness, 32 in FIG. 2A, is sized such that its thermal resistance is equal to the effective thermal resistance of the convective transfer HI. That is, R1 = 1/HI. Similarly, the disk's absorptivity is preferably selected such that PS = PC. Further, for the thermistor arrangement of FIG. 2A, the thermal resistance of the housing to the freely convecting inside air is preferably made much smaller than the thermal resistance to the window. This makes TH virtually equal to TI.

As seen from the equations, these selections make the net energy gain of the collector and the sensor identical when the temperature of the disk, TD, is equal to the inside temperature, TI. Further, since there is no energy flow from the radiation collecting disk to the room when TD = TH = TI, the net energy gain for the sensor and, hence, the room is exactly zero at this balance point. Similarly, if the disk gets warmer than the room (TD > TI), it is receiving enough energy to meet its loss to the window and still have some left to flow into the room; this condition is above the balance point.

Having identified the principles governing the method of measurement, the equations which follow show a preferred design procedure by which this method of sensing thermal gain is incorporated in a practical sensor.

First, the thickness of the fluid-space between the disk and the window, namely the thin chamber 32, is determined such that R1 approximately equals HI over the temperature range of interest. The thermal resistance of the thin space is:

R1 = XA/(KA*AD)

where:

XA = disk to window spacing
KA = thermal conductivity of the fluid
AD = area of the disk The expression for HI is more complex:

HI = KA*NU/HT where:

NU = the Nusselt number
HT = height of the fluid barrier (window)

The Nusselt number can be calculated from the Grashof number and the Prandtl number for air at various temperatures. The Nusselt number relates the heat being transferred by convection and conduction to that which would be transferred by conduction alone, such as in perfectly still air. That is, the condition that NU = 1 implies that the heat transfer is by pure conduction. A Nusselt number of 1.5 implies that the heat transfer is 50% greater than it would be for still fluid or that ⅓ of the heat is being transferred by convection. For this invention, the heat transfer from the disk to the barrier should be primarily by conduction, not convection. For this to be true with no more that 10% error, the Nusselt number should be no greater than 1.1.

Using the equations, XA is adjusted by the Method of Lease Squares or an equivalent technique, to provide the best correlation between R1 and HI over the temperature range of interest. Fluids other than the inside fluid and/or electronic means may be employed to improve the correlation when warranted.

Because the iterative computation technique requires tens of thousands of calculations to reach an answer, a numerical example of this calculation is not practical. Instead, the computer program used for this calculation is included as Appendix I. This program is written in standard BASIC and can be easily adapted to most computers.

Table I shows the computer printout from the program of Appendix I. The program has computed 0.28 inches as the best air-space for the parameters given at the top of the Table. The temperatures of Column 1 are calculated from the inside temperature (68° F.), the chosen window temperature (Column 2), the thermal resistance of the window, and the theoretical inside and outside convection coefficients. The data below the main listing shows that the results are nearly independent of window height.

It is also preferred in such design to make the thermal loss from the disk to the window 1/R1 much larger, preferably 20 or more times larger, than the loss from the disk to the periphery 1/R2 and the housing 1/R3. That is, 95% or more of the heat loss should be to the window. The loss to the window can always be made large compared to the loss to the periphery because 1/R1 increases as the disk diameter squared whereas 1/R2 increases only directly with the diameter of the disk. Thus, in FIG. 2 and FIG. 4, the disk diameter has been increased by design until the loss to the periphery is less than 2% of that to the window. This results in a disk diameter of 1.5 inches for both embodiments.

Referring to the energy loss equation for the disk, the above thermal loss criteria allows accurate operation with the housing temperature TH not equal to the inside temperature TI. The embodiment of FIG. 4A meets said criteria, allowing the second temperature sensor T2 to be remotely mounted, preferably in the Controller. When this thermistor arrangement is used in conjunction with an internally mounted thermal shutter as in FIG. 1, the sensor may be covered by the thermal shutter, eliminating the need for a separate mounting site for the sensor.

TABLE I

| Outside Temp | Window Temp | Window Loss | Disk Loss | Error |
|---|---|---|---|---|
| Window height, ft | 12 | Min window temp, F. | 35 | |
| Inside temperature, F. | 68 | Max window temp, F. | 85 | |
| Air space, inches | .28 | R of window | 1.45 | |
| Loss rate units are BTU/hr/sqft, temperatures in F. | | | | |
| 1 | 35 | −23.2 | −2∅.41 | −2.8 |
| 13 | 4∅ | −18.54 | −17.4 | −1.1 |
| 24 | 45 | −14.19 | −14.35 | .2 |
| 35 | 5∅ | −1∅.19 | −11.28 | 1.1 |
| 45 | 55 | −6.57 | −8.18 | 1.6 |
| 55 | 6∅ | −3.43 | −5.∅6 | 1.6 |
| 64 | 65 | −.93 | −1.9 | 1 |
| 71 | 7∅ | .54 | 1.28 | −.7 |
| 79 | 75 | 2.83 | 4.48 | −1.7 |
| 88 | 8∅ | 5.76 | 7.72 | −2 |
| 98 | 85 | 9.11 | 1∅.98 | −1.9 |
| Window height, ft 4 | | | | |
| 1 | 35 | −23.45 | −2∅.41 | −3 |
| 55 | 6∅ | −3.47 | −5.∅6 | 1.6 |
| 98 | 85 | 9.21 | 1∅.98 | −1.8 |
| Window height, ft 2∅ | | | | |
| 2 | 35 | −23.∅8 | −2∅.41 | −2.7 |
| 55 | 6∅ | −3.41 | −5.∅6 | 1.6 |
| 98 | 85 | 9.∅7 | 1∅.98 | −1.9 |

For proper operation, the disk must have the same radiant absorptivity as the space inside the barrier. This can be achieved by painting or staining the disk. A black anodized aluminum disk is particularly practical since there is little vapor released from the stain. Such vapors as come from oil paints and some plastics may fog the window in time. The absorptivity may be varied by using a fine cross-hatching or half-screen pattern if the disk has a high thermal conductivity which can average the local heating effects.

Properties of the disk also control the response time of the sensor. The time required to raise or lower the temperature of the disk depends on the rate of energy gain or loss and the thermal capacity of the disk. By making the disk thick and of a high heat capacity material, such as steel or copper, a slow response is obtained. In solar space heating applications, this is useful to prevent shutter movement for brief insolation changes such as those caused by passing clouds. Conversely, by making the disk of thin, low heat capacity material such as metalized polyester, a fast thermal response is obtained. This is useful for instruments and process control.

In addition to directly controlling shutter movement, the sensor may also be used as an indicating instrument. For instance, the sensor may be mounted as described above but may merely warn an operator of a change in the direction of net energy flow by emitting a sound or blinking a light. Such an installation is useful where the movable insulation cannot be easily motorized but can be moved by hand. For instance, farmers and gardeners might determine when to cover and un-cover a field of insulated cold-frames based on the thermal gain in one representative cold-frame.

In some cases, it may be useful to gather information about the effectiveness of an experimental collector system. Here the sensor's output would be sent to a strip chart recorder or the like to give a record of the length of time that the net energy gain for the experimental collector was positive.

Having described two embodiments of the present method, it should now become apparent to those skilled in the art that numerous modifications and embodiments are contemplated as falling within the scope of this invention.

```
1∅  REM** Appendix 1
2∅  REM** Thermal Gain Sensor
3∅  REM** Thin Space Calculations
4∅  REM**
5∅  REM** James A. Kuzdrall
6∅  REM** Box 1247
7∅  REM** Nashua, NH ∅3∅61
8∅  REM**
9∅  REM**
1∅∅ REM** Table of Contents
11∅ REM**
12∅ GOTO 15∅: REM Executive Program
13∅ GOTO 21∅: REM Air space vs window height
14∅ GOTO 149∅: REM Thermal parameter subroutine
15∅ REM**
16∅ REM** Executive Program
17∅ REM**
18∅ GOSUB 21∅: REM Air space vs window height
19∅ END
2∅∅ REM**
21∅ REM**Air space vs window height and related calculations
22∅ REM**
23∅ REM** Variables
24∅ REM**
25∅ REM AD = Area of disk, sqft
26∅ REM BA = Coefficient of volume expansion, 1/(degrees R)
27∅ REM DA = Density of air, lbm/cuft
28∅ REM GV = Gravitational acceleration, ft/sec/sec
29∅ REM HI = Convection coeff, inside, BTU/(hr*sqft*F)
3∅∅ REM HT = Height of window, ft
31∅ REM KA = Thermal conductivity of still air, BTU/(hr*ft*F)
32∅ REM NU = Nusselt number, dimensionless
33∅ REM PR = Prandtl number, dimensionless
34∅ REM QD = Heat loss of disk, BTU/sqft/hr
35∅ REM QW = Heat loss of window, BTU/sqft/hr
36∅ REM R1 = Thermal resistance of air space
37∅ REM RW = Thermal resistance of window
38∅ REM TF = Mean film temperature, F.
39∅ REM TH = Highest window temperature, F.
4∅∅ REM TI = Temperature of air inside room, F.
41∅ REM TL = Lowest window temperature, F.
42∅ REM TW = Temperature of inside window surface, F.
43∅ REM VA = Viscosity of air, sqft/sec
44∅ REM XS = Disk to window spacing, ft
45∅ REM**
46∅ DIM D(3,4): REM Thermal data matrix
47∅ FOR J=∅ TO 2
48∅ FOR K=∅ to 4
49∅ READ D(J,K)
5∅∅ NEXT K
51∅ NEXT J
52∅ REM Temp, Density, Viscosity, Conductivity, Prandtl Nr
53∅ DATA −1∅, .∅882, 1∅.22 E-5, .∅1287, .722
54∅ DATA 8∅, .∅735, 16.88 E-5, .∅1516, .7∅8
55∅ DATA 17∅, .∅623, 22.38 E-5, .∅1735, .697
56∅ REM**
57∅ REM**Linear interpolation for TF below 8∅
```

-continued

```
580 DEF FNL(I)=D(0,I)+(D(1,I)-D(0,I))*(D(0,0)-TF)/
    (D(0,0)-D(1,0))
590 REM**
600 REM**Linear interpolation for TF = or above 80 F.
610 DEF FNH(I)=D(1,I)+(D(2,I)-D(1,I))*(D(1,0)-TF)/
    (D(1,0)-D(2,0))
620 REM**
630 REM**Constants
640 GV=32.2: AD=1
650 REM**
660 REM**Find the best air space
670 PRINT "Find the best air space for:"
680 HT$="Window height, ft"
690 TI$="Inside temperature, F."
700 TL$="Min window temp, F."
710 TH$="Max window temp, F."
720 XS$="Air space, inches"
730 RW$="R of window"
740 PRINT HT$;: INPUT HT
750 PRINT TI$;: INPUT TI
760 PRINT TL$;: INPUT TL
770 PRINT TH$;: INPUT TH
780 PRINT RW$;: INPUT RW
790 INPUT "Output to: Terminal=0, Selectric=1,
    Comprint=2";A
800 PRINT CHR$(A);: REM Activate output device
810 XS=.19/12: REM Starting air space, ft
820 DX=.01: REM Step to increase space by, inches
830 E1=1E30: REM Error for last calc, make it high
840 E=0
850 FOR TW=TL TO TH STEP 2
860 GOSUB 1490: REM CALC HI,R1,QW,QD
870 E=E+ABS(QD-QW) ↑ 2
880 NEXT TW
890 IF E > E1 GOTO 930
900 XS=XS+DX/12
910 E1=E
920 GOTO 840: REM Repeat RMS error calc, new air space
930 XS=XS-DX/12
940 REM**
950 REM**Print table heading
960 PRINT "Thermal Gain Shutter Controller"
970 N=8
980 FOR I=1 TO N: PRINT: NEXT I
990 PRINT TAB(27); "Table I"
1000 PRINT
1010 N=36
1020 PRINT HT$;HT;TAB(N);TL$;TL
1030 PRINT TI$;TI;TAB(N);TH$;TH
1040 PRINT XS$;XS*12;TAB(N);RW$;RW
1050 N=5
1060 PRINT TAB(N);
1070 PRINT "Loss rate units are BTU/hr/sqft,
    temperatures in F."
1080 REM**
1090 REM**Print 3 tables
1100 REM**
1110 TS=5: HT=12
1120 GOSUB 1290: REM PRINT TABLE
1130 REM**
1140 TS=25: HT=4
1150 PRINT HT$;HT
1160 GOSUB 1290: REM PRINT A SHORTER TABLE
1170 REM**
1180 HT=20
1190 PRINT HT$;HT
1200 GOSUB 1250:REM PRINT ANOTHER SHORT TABLE
1210 REM**
1220 N=7
1230 FOR I=1 to N: PRINT: NEXT I
1240 N=58
1250 PG=8
1260 PRINT TAB(N); "Page"; PG
1270 PRINT CHR$(12);CHR$(0);
1280 RETURN
1290 PRINT
1300 S1=10: REM Tab
1310 PRINT TAB(S1);"Outside Window Window Disk Error"
1320 PRINT TAB(S1);"Temp Temp Loss Loss    "
1330 FOR TW=TL TO TH STEP TS
1340 GOSUB 1490: REM CALC HI,R1,QW,QD
1350 PRINT TAB(S1);INT(TW+RW*QW+.5);
1360 PRINT TAB(S1+10);TW;
1370 PRINT TAB(S1+20);INT(100*QW+.5)/100;
1380 PRINT TAB(S1+30);INT(100*QD+.5)/100;
1390 IF QW=0 THEN S=0: GOTO 1410
1400 S=100*(QW-QD)/QW
1410 PRINT TAB(S1+40);INT(10*(QW-QD)+.5)/10
1420 N=N+1
1430 E=E+S*S
1440 NEXT TW
1450 PRINT
1460 PRINT
1470 RETURN
1480 REM**
1490 REM**Calculation subroutine
1500 TF=(TW+TI)/2
1510 IF TF > D(1,0) THEN 1580
1520 REM**Interpolate values 80 or lower
1530 DA=FNL(1)
1540 VA=FNL(2)
1550 KA=FNL(3)
1560 PR=FNL(4)
1570 GOTO 1630
1580 REM**Interpolate values above 80 F.
1590 DA=FNH(1)
1600 VA=FNH(2)
1610 KA=FNH(3)
1620 PR=FNH(4)
1630 REM**Calculate HI
1640 BA=1/(TF+460)
1650 GR=GV*BA*ABS(TW-TI)*HT*HT*HT/(VA*VA)
1660 HI=KA*.13*(GR*PR) ↑ .33/HT
1670 REM**Calculate thermal R of gap, R1
1680 R1=XS/(KA*AD)
1690 REM**Heat loss for disk and window, BTU/sqft/hr
1700 QW=HI*(TW-TI)
1710 QD=(TW-TI)/R1
1720 RETURN
```

What is claimed is:

1. An apparatus for sensing the direction of net energy flow through a fluid-separation barrier which is transparent to radiant energy traveling from a source on one side of the barrier to a fluid-filled space on the other side of the barrier, the apparatus comprising:

means for defining a thin space that is filled with a thermally conductive means and is of such width as to simulate the convective heat transfer from said fluid-filled space to the barrier, said thin space-defining means comprising a radiant energy absorbing surface that forms one side of said thin space, is thermally insulated from said fluid-filled space, and simulates the radiant absorbency of said fluid-filled space, means for mounting said thin space-defining means to the barrier with the barrier itself forming the other side of said thin space thereby simulating the thermal loss due to conduction through the barrier and convection outside the barrier, a first temperature sensing means for detecting the temperature of said radiant energy absorbing surface, a second temperature sensing means for detecting the temperature of said fluid-filled space, and means responsive to said first and second temperature sensing means for producing a control signal indicating net thermal gain when said first temperature is greater than said second temperature.

2. Apparatus as set forth in claim 1 wherein the width of the thin space is determined by best equalizing over the operating temperatures the conductive transfer from the radiant energy absorbing surface to the barrier with the free convective transfer of the fluid in said fluid-filled space to the barrier such that:

R1 appproximates 1/HI
where:
R1 = the thermal resistance, radiant energy absorbing surface to barrier, a function of the surface and barrier temperatures
HI = convective transfer coefficient, the fluid in said fluid-filled space to barrier, a function of barrier temperature and the temperature of the fluid in said fluid-filled space.

3. Apparatus as set forth in claim 2 wherein the choice of thermally conductive means provides a way of improving the approximation over temperature.

4. Apparatus as set forth in claim 2 wherein electrical and thermal corrections in the first and second temperature sensing means provide a way of improving the approximation over temperature.

5. Apparatus as set forth in claim 1 wherein the thermally conductive means is a fluid such that the Nusselt number associated with the thin space and said fluid is 1.1 or less.

6. Apparatus as set forth in claim 1 wherein the thermally conductive means is a fluid such that the heat transfer through the thin space is primarily by conduction and radiation, not convection.

7. Apparatus as set forth in claim 1 wherein the thin space has a width less than one inch.

8. Apparatus as set forth in claim 1 wherein the thermally conductive means and the fluid in said fluid-filled space are the same.

9. Apparatus as set forth in claim 1 wherein the thermally conductive means and the fluid in said fluid-filled space are both air and the thin space has a width on the order of 0.28 inches.

10. Apparatus as set forth in claim 1 wherein the radiant energy absorbing surface has the form of a thin disk.

11. Apparatus as set forth in claim 10 wherein the heat loss from the disk is primarily through the thin space.

12. Apparatus as set forth in claim 10 wherein more than 95% of the heat loss from the disk is through the thin space.

13. Apparatus as set forth in claim 10 wherein the disk has a diameter on the order of 1.5 inches.

14. Apparatus as set forth in claim 10 wherein the thermal mass of the disk provides a means by which to control the response time of the sensor.

15. Apparatus as set forth in claim 10 wherein the disk is of metal for high thermal mass.

16. Apparatus as set forth in claim 10 wherin the disk includes a darkening means whereby the radiant energy absorption of said disk is matched to that of the fluid-filled space.

17. Apparatus as set forth in claim 1 wherein said means for defining said thin space comprises a housing open at one end and said radiant energy absorbing surface is part of a member disposed within said housing in spaced relation to said open end.

18. Apparatus as set forth in claim 17 wherein said member is a disk mounted to said housing by means of peripheral tabs to reduce thermal loss to said housing.

19. Apparatus as set forth in claim 17 wherein the housing thermally insulates and supports said member.

20. Apparatus as set forth in claim 19 wherein the housing includes means to remove moisture therefrom.

21. Apparatus as set forth in claim 19 wherein the housing provides shielding from electrical interference.

22. Apparatus set forth in claim 17 wherein said radiant-energy absorbing surface is on one side of said member.

23. Apparatus as set forth in claim 17 wherein the housing supports the second temperature sensing means in thermal contact with the fluid in said fluid-filled space.

24. Apparatus as set forth in claim 22 wherein said first temperature sensing means is carried by said member.

25. Apparatus as set forth in claim 24 wherein said first temperature sensing means is in thermal contact with said radiant energy absorbing surface.

26. Apparatus as set forth in claim 1 wherein the first temperature sensing means comprises a thermistor mounted in thermal contact with the radiant energy absorbing surface.

27. Apparatus as set forth in claim 1 wherein the second temperature sensing means responds to the temperature of said fluid-filled space in the immediate vecinity of the sensor.

28. Apparatus as set forth in claim 1 wherein the second temperature sensing means responds to the temperature of said fluid-filled space at a remote point.

29. Apparatus as set forth in claim 1 wherein the second temperature sensing means comprising a thermistor in thermal contact with the fluid in said fluid-filled space.

30. A controller responsive to net energy flow used in conjunction with a fluid separation barrier which transmits radiant energy flux to a first fluid from a second fluid, said controller comprising:
a sensor means for determining the direction of net energy flow through said fluid separation barriers, said sensor comprising a radiation receiving surface, means for supporting said radiation receiving surface in proximity to said barrier so that an enclosed space is formed between said radiation receiving surface and said barrier and so that said enclosed space simulates the convective heat transfer from said first fluid to said barrier, and a first temperature sensing means for measuring a reference temperature produced in said sensor by flow of energy between said radiation receiving surface and said barrier,
a second temperature sensing means for measuring the temperature of said first fluid, and
means responsive to said first and second temperature sensing means for producing a control signal indicating net thermal gain into said first fluid when said first temperature is greater than said second temperature.

31. A controller as set forth in claim 30 further including means responsive to said control signal for producing a desired function.

32. A controller as set forth in claim 31 wherein the desired function is to produce a recordable stimulus used for gathering information.

33. A controller as set forth in claim 30 in combination with a thermal barrier movable so as to limit heat transfer through said fluid separation barrier, and means responsive to said control signal for moving said thermal barrier in accordance with changes in said control signal.

34. In combination with a solar collector window which is interposed between a fluid-filled space and the outside environment and has a shutter to limit heat transfer therethrough, a controller for opening and closing said shutter in response to thermal gain, said controller comprising:
- a sensor for determining the direction of net energy flow through said collector window, said sensor comprising a radiation-receiving surface, means for mounting said surface in proximity to said window so that an enclosed space is formed between said surface and window and so that said enclosed space has a heat loss through said window which simulates the thermal loss from said fluid-filled space due to conduction through the window and convection in said outside environment, a first temperature sensing means for measuring a reference temperature produced in said sensor by flow of energy into and out of said enclosed space through said window, a second temperature sensing means for measuring the temperature, of said fluid-filled space;
- means responsive to said first and second temperature sensing means for producing a control signal indicating net thermal gain into said fluid-filled space when said first temperature is greater than said second temperature,
- motive means for moving said shutter to an open or closed position, and
- means responsive to said control signal for causing said motive means to move said shutter to said open or closed position.

35. A controller as set forth in claim 34 wherein the motive means is manual with the operator being responsive to a sensory signal, causing the shutter to open and close.

36. A controller as set forth in claim 35 wherein the sensory signal is electrically produced from battery power.

37. A controller as set forth in claim 35 wherein the sensory signal is electrically produced from power generated by solar cells mounted in the sensor means.

38. A controller as set forth in claim 34 wherein the motive means is motorized with a power amplifier being responsive to an electrical control signal causing the shutter to open and close.

39. A controller as set forth in claim 34 wherein the first and second temperature sensing means form part of a bridge network thereby producing an electrical control signal.

40. A controller as set forth in claim 34 wherein the second temperature sensing means is located in a conrol box separate from the sensor apparatus.

41. A controller as set forth in claim 40 wherein the control box is positioned to sense the nominal inside air temperature whether the shutter means is open or closed.

42. A controller as set forth in claim 34 wherein the means responsive to the control signal includes a seasonal switch which is set to either minimize or maximize the energy gain in the collector.

43. A controller as set forth in claim 34 wherein the means responsive to the control signal includes a mode switch for permitting either automatic or manual control.

44. An apparatus for sensing the direction of net energy flow through a fluid separation barrier which is transparent to radiant energy and separates a first space containing a first fluid from a second space which contains a second fluid, said apparatus comprising:
- a housing open at one end and arranged so that said open end may engage and be attached to a first side of said barrier facing said first space;
- partitioning means within said housing disposed so that when said open end is engaged with said first side of said barrier a thin space filled with a thermally conductive fluid is formed between said barrier and said partitioning means, said space being of such width measured between said barrier and said partitioning means as to simulate the convective heat transfer from said first fluid to said barrier, whereby the flow of energy between said thin space and said second fluid via said barrier simulates the thermal loss from said first space to said second space due to conduction through the barrier and convection in said second fluid;
- a radiation absorbing surface on said partitioning means facing said open end of the housing;
- means in said housing thermally insulating said radiation absorbing surface from said first fluid; and
- temperature sensing means for producing a signal which is representative of the temperature of said radiation receiving surface, whereby said signal may be processed with a second signal representative of the temperature of said first fluid so as to provide a control signal indicative of the thermal gain or loss experienced by said first fluid as a consequence of net energy flow through said barrier.

45. Apparatus according to claim 44 wherein said temperature sensing means is attached to said partitioning means.

46. Apparatus according to claim 45 wherein said housing is made of plastic, and further including a second temperature means for producing a signal representative of the temperature of the fluid in said first space, and means responsive to the signals from both of said temperature sensing means for producing said control signal.

47. Apparatus according to claim 44 wherein said housing has a shoulder on its interior and further wherein said radiation absorbing surface is part of a member disposed within said housing and supported by means engaged with said shoulder.

48. A controller for determining the direction of net energy flow between a first inside fluid and a second outside fluid via a fluid separation barrier which is capable of transmitting radiant energy flux from said outside fluid to said inside fluid, said controller comprising:
- a housing adapted to be attached to said barrier in said first fluid;
- a dark radiation-absorbent member in said housing for receiving radiant energy passing through said barrier from said second fluid, said member being thermally insulated from said first fluid;
- a first solid state temperature sensing means in said housing in thermal contact with said member and producing a first signal varying in accordance with changes in temperature of said member;
- a second solid state temperature sensing means for sensing the temperature of said first fluid and producing a second signal varying in accordance with changes in the temperature of said first fluid; and
- means responsive to said first and second signals for producing a third signal indicative of the net thermal gain into said first fluid resulting from radiant energy received via said second fluid.

* * * * *